United States Patent
Itoh et al.

(10) Patent No.: US 6,599,637 B1
(45) Date of Patent: Jul. 29, 2003

(54) SILICON NITRIDE COMPOSITE SUBSTRATE

(75) Inventors: Ai Itoh, Itami (JP); Michimasa Miyanaga, Itami (JP); Masashi Yoshimura, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/830,219

(22) PCT Filed: Oct. 25, 1999

(86) PCT No.: PCT/JP99/05910

§ 371 (c)(1),
(2), (4) Date: Apr. 24, 2001

(87) PCT Pub. No.: WO00/24692

PCT Pub. Date: May 4, 2000

(30) Foreign Application Priority Data

Oct. 28, 1998 (JP) ............................................ 10-306497

(51) Int. Cl.$^7$ ............................ B32B 15/04; B32B 9/04; C04B 35/00
(52) U.S. Cl. ...................... 428/472; 428/704; 428/698; 501/97.1; 501/97.2; 501/97.3
(58) Field of Search ................................. 428/472, 704, 428/698; 501/97.1, 97.2, 97.3, 123

(56) References Cited

U.S. PATENT DOCUMENTS

| | | | | |
|---|---|---|---|---|
| 4,540,462 A | * | 9/1985 | Mizunoya et al. ............. 216/33 |
| 4,746,636 A | * | 5/1988 | Yokoyama ................... 501/97.3 |
| 5,439,856 A | * | 8/1995 | Komatsu ...................... 264/683 |
| 5,928,768 A | * | 7/1999 | Ikeda et al. .................. 428/209 |
| 6,086,990 A | * | 7/2000 | Sumino et al. .............. 428/336 |
| 6,143,677 A | | 11/2000 | Miyanaga et al. | |

FOREIGN PATENT DOCUMENTS

| | | |
|---|---|---|
| EP | 766307 | 4/1997 |
| JP | 9-153567 | 6/1997 |
| JP | 2698780 | 9/1997 |
| JP | 9-157054 | 9/1997 |
| JP | 10-93211 | 4/1998 |
| JP | 10-167804 | 6/1998 |
| WO | 9808256 | 2/1998 |

\* cited by examiner

*Primary Examiner*—Deborah Jones
*Assistant Examiner*—G. A. Blackwell-Rudasill
(74) *Attorney, Agent, or Firm*—McDermott, Will & Emery

(57) ABSTRACT

A $Si_3N_4$ composite substrate which manifests no generation of cracking on the substrate even by mechanical shock or thermal shock, and is excellent in heat radiation property and heat-cycle-resistance property is obtained by using a $Si_3N_4$ substrate as a ceramic substrate. A $Si_3N_4$ substrate having a thermal conductivity of 90 W/m·K or more and a three-point flexural strength of 700 MPa or more is used, and the thickness tm of a metal layer connected on one major surface of the substrate and the thickness tc of the $Si_3N_4$ substrate are controlled so as to satisfy the relation formula: 2 tm $\leq$ tc $\leq$ 20 tm. When metal layers are connected to both major surfaces of the $Si_3N_4$ substrate, the thickness tc and the total thickness ttm of the metal layers on both major surfaces are controlled so as to satisfy the relation formula: ttm $\leq$ tc $\leq$ 10 ttm.

9 Claims, 1 Drawing Sheet

SILICON NITRIDE COMPOSITE SUBSTRATE

TECHNICAL FIELD

The present invention relates to a composite substrate such as a power module and the like comprising mounted exothermic electronic parts such as semiconductor elements, particularly, to a ceramic composite substrate which has a structure comprising a ceramic substrate connected with a metal layer, and has excellent heat radiation property, mechanical strength and heat-cycle-resistance property.

BACKGROUND ART

Conventionally, ceramic composite substrates obtained by connecting a metal plate composed mainly of copper or aluminum as an electric conductive layer to the surface of a ceramic substrate made of $Al_2O_3$, AlN, BeO and the like having electric insulation property have been widely used as constituent parts of various electric appliances.

Of these conventional ceramic composite substrates, those using an $Al_2O_3$ substrate as a ceramic substrate cannot acquire excellent heat radiation property due to the low thermal conductivity of $Al_2O_3$, and those using a BeO substrate have high thermal conductivity and excellent heat radiation properties. The drawback, however, is that they are difficult to manage in production due to toxicity thereof. Composite substrates using an AlN substrate are excellent in heat radiation property because of the high thermal conductivity of AlN; however, their disadvantage is that they tend to crack by mechanical shock, and thermal load in repeated use under practical conditions due to the low mechanical strength of AlN.

On the other hand, ceramics containing mainly $Si_3N_4$ are materials which generally show excellent heat resistance even under the atmosphere of a high temperature of 1000° C. or more, and have low thermal expansion coefficient and also excellent thermal shock resistance, in addition to an inherent high strength property. Consequently, the application of the ceramics as a high temperature structural material to various high temperature high strength parts has been tried.

Recently, studies have been done on a ceramic substrate to be used in a composite substrate, by utilizing the high strength property owned inherently by ceramics containing mainly $Si_3N_4$. For example, JP-B-No2698780, and JP-A No. 9-157054 disclose a trial in which insufficient thermal conductivity is compensated by enhancing the head radiation property of the whole circuit, in a composite circuit board comprising $Si_3N_4$ substrates connected with a metal circuit plate, by making the thickness of the $Si_3N_4$ substrate smaller than 1 mm.

However, it is believed that, even in a $Si_3N_4$ substrate having higher strength than that of AlN, cracking also tends to occur by mechanical shock in installation and mounting or by thermal shock by a heat cycle similarly to the AlN substrate, and practical use of the $Si_3N_4$ substrate is difficult when the substrate are excellent in heat radiation property because of the high thermal conductivity of AlN; however, their disadvantage is that they tend to crack by mechanical shock, and thermal load in repeated use under practical conditions due to the low mechanical strength of AlN.

On the other hand, ceramics containing mainly $Si_3N_4$, are materials which generally show excellent heat resistance even under the atmosphere of a high temperature of 1000° C. or more, and have low thermal expansion coefficient and also excellent thermal shock resistance, in addition to an inherent high strength property. Consequently, the application of the ceramics as a high temperature structural material to various high temperature high strength parts has been tried.

Recently, studies have been done on a ceramic substrate to be used in a composite substrate, by utilizing the high strength property owned inherently by ceramics containing mainly $Si_3N_4$. For example, JP-B No. 269870 and JP-A No. 9-157054 disclose a trial in which insufficient thermal conductivity is compensated by enhancing the head radiation property of the whole circuit, in a composite circuit board comprising $Si_3N_4$ substrates connected with a metal circuit plate, by making the thickness of the $Si_3N_4$ substrate smaller than 1 mm.

However, it is believed that, even in a $Si_3N_4$ substrate having higher strength than that of AlN, cracking also tends to occur by mechanical shock in installation and mounting or by thermal shock by a heat cycle similarly to the AlN substrate, and practical use of the $Si_3N_4$ substrate is difficult when the thickness of the substrate is small. The reason for this is, for example, that in a process of fabricating a ceramic composite substrate into an apparatus, the composite substrate must be fixed to the main part of the apparatus by screwing and the like. However, the occurrence of cracking by a pressing force by the screw and by shock in handling is inevitable even in a $Si_3N_4$ substrate having excellent mechanical strength when the thickness thereof is small. When such cracking occurs, insulation failure occurs at the cracked part, and the composite substrate becomes unusable because of dielectric breakdown.

An object of the present invention is to provide a ceramic composite substrate which manifests no generation of cracking on the substrate even by mechanical shock or thermal shock, and has an excellent heat radiation property and heat-cycle-resistance property, in view of such conventional conditions.

DISCLOSURE OF INVENTION

The present inventors have studied and developed, for attaining the above-mentioned object, a $Si_3N_4$ substrate material having high thermal conductivity and high strength, and found that when the ratio of the thickness of the $Si_3N_4$ substrate to the thickness of the metal plate is set at a given value in a composite substrate obtained, fastening cracks and the like in a fabrication process can be dissolved, and heat-cycle-resistance property can be significantly improved, and that the heat radiation property of a composite substrate can be considerably improved by enhancing heat the conductivity of a $Si_3N_4$ substrate, leading to the completion of the invention.

Namely, a ceramic composite substrate provided by the present invention comprises a silicon nitride ceramic substrate having a thermal conductivity of 90 W/m·K or more and a three-point flexural strength of 700 MPa or more, and a metal layer connected to one major surface thereof, and in the composite substrate, the thickness tc of the silicon nitride ceramic substrate and the thickness tm of the metal layer satisfy the relation formula: $2\ tm \leq tc \leq 20\ tm$.

Further, another silicon nitride composite substrate provided by the present invention comprises a silicon nitride ceramic substrate having a thermal conductivity of 90 W/m·K or more and a three-point flexural strength of 700 MPa or more, and metal layers connected to both major surfaces thereof, and in the composite substrate, the thickness tc of the silicon nitride ceramic substrate and the total thickness ttm of the metal layers on both major surfaces satisfy the relation formula: ttm≦tc≦10 ttm.

In the above-mentioned silicon nitride composite substrate of the present invention, the silicon nitride ceramic substrate before connection of the metal plate preferably is warped such that the major surface on which semiconductor elements are mounted forms a concave surface, and specific warp degree thereof is preferably in the range from 10 to 300 $\mu$m per 25.4 mm (inch) of the length of the substrate.

The silicon nitride ceramic substrate used in a silicon nitride composite substrate of the present invention contains a rare earth element in an amount of 0.6 to 10% by weight in terms of an oxide and at least one element selected from Mg, Ti, Ta, Li and Ca in an amount of 0.5 to 1.0% by weight in terms of an Namely, a ceramic composite substrate provided by the present invention comprises a silicon nitride ceramic substrate having a thermal conductivity of 90 W/m·K or more and a three-point flexural strength of 700 MPa or more, and a metal layer connected to one major surface thereof, and in the composite substrate, the thickness tc of the silicon nitride ceramic substrate and the thickness tm of the metal layer satisfy the relation formula: 2tm≦tc≦20 tm.

Further, another silicon nitride composite substrate provided by the present invention comprises a silicon nitride ceramic substrate having a thermal conductivity of 90 W/m·K or more and a three-point flexural strength of 700 MPa or more, and metal layers connected to both major surfaces thereof, and in the composite substrate, the thickness tc of the silicon nitride ceramic substrate and the total thickness ttm of the metal layers on both major surfaces satisfy the relation formula: ttm≦tc≦10 ttm.

In the above-mentioned silicon nitride composite substrate of the present invention, the silicon nitride ceramic substrate before connection of the metal plate preferably is warped such that the major surface on which semiconductor elements are mounted forms a concave surface, and specific warp degree thereof is preferably in the range from 10 to 300 $\mu$m per 25.4 mm (inch) of the length of the substrate.

The silicon nitride ceramic substrate used in a silicon nitride composite substrate of the present invention contains a rare earth element in an amount of 0.6 to 10% by weight in terms of an oxide and at least one element selected from Mg, Ti, Ta, Li and Ca in an amount of 0.5 to 1.0% by weight in terms of an oxide, and impurity oxygen in an amount of 2% by weight or less and Al in an amount of 0.2% by weight or less in terms of an oxide.

The $Si_3N_4$ substrate used in a ceramic composite substrate of the present invention will be described below. The ceramic substrate used in a composite substrate is required to be a compact sintered body simultaneously having high thermal conductivity and high strength property. The reason for lower thermal conductivity of a conventional $Si_3N_4$ sintered body is that impurities are solved in $Si_3N_4$ particles of the sintered body and phonons, and carriers for heat conduction, are scattered. Since $Si_3N_4$ is a sintering-resistant ceramic, the addition of a sintering aid which allows the formation of liquid phase at lower temperatures is necessary, and it is known that this sintering aid is solved in the particles to lower thermal conductivity.

Consequently, in the present invention, thermal conductivity of a $Si_3N_4$ sintered body is improved in addition to inherent excellent mechanical strength by selecting the kind of sintering aid and controlling the amount of the aid added in a given range, and the resulted sintered body is used as a ceramic substrate. Namely, in the present invention, a rare earth oxide and an oxide of at least one element selected from Mg, Ti, Ta, Li and Ca are used together as sintering aids for $Si_3N_4$.

A rare earth oxide is effective for higher thermal conductivity of a sintered body since the oxide is scarcely solved in $Si_3N_4$ particles. Of rare earth oxides, it is preferable to use oxides of Y, Yb and Sm, because they enable easy crystallization of the grain boundary phase. Crystallization of the grain boundary phase is effective for simultaneously attaining high strength and high thermal conductivity since strength at higher temperatures increases and scattering of phonons at the grain boundary phase is reduced by this crystallization. Further, the amount of these added rare earth oxides is preferably in the range from 0.6 to 10% by weight. When the amount is lower than 0.6% by weight, the liquid phase is not sufficiently formed and compaction does not progress in the sintering process. Consequently, porosity after the sintering increases and thermal conductivity decreases, and mechanical strength also lowers simultaneously. On the other hand, when the amount is less than 10% by weight, the proportion of the grain boundary phase occupying a sintered body increases and thermal conductivity decreases.

Other sintering aids, oxides of Mg, Ti, Ta, Li and Ca react with $SiO_2$ on the surface of a $Si_3N_4$ particle at temperatures of 160° C. or less to form a liquid phase, being effective to promote compaction in the sintering process. The addition of these oxides in a total amount of a low 0.5 to 1% by weight improves the sintering property significantly as compared with the single addition of rare earth oxides, and further, minimally affects the reduction in thermal conductivity. However, when the total added amount of these oxides of Mg, Ti, Ta, Li and Ca is over 1% by weight, there is the fear of a remarkable reduction in thermal conductivity by solving of these elements in $Si_3N_4$ particles. Further, when Mg, Ti, Ta, Li and Ca are contained in grain boundary phase components, an amorphous glass component is formed in the grain boundary phase, also leading to a reduction in thermal conductivity and a decrease in strength at higher temperatures.

Further, by enhancing the purity of a raw material powder, thermal conductivity of the resulting $Si_3N_4$ sintered body can be improved. It is widely known that oxygen and Al are easily solved in $Si_3N_4$ particles to reduce thermal conductivity. Therefore, in a $Si_3N_4$ substrate of the present invention, the thermal conductivity of a Si,N, sintered body can be further improved by controlling the amount of oxygen to 2% by weight or less and the amount of Al to 0.2% by weight or less, the oxygen and Al being used as impurities in a raw material powder of the sintered body, particularly in a $Si_3N_4$ powder.

The thus produced $Si_3N_4$ sintered body has excellent thermal conductivity properties at room temperatures of 90 W/m·K or more and a three-point flexural strength of 700 MPa or more. By increasing thermal conductivity beyond a conventional $Si_3N_4$ substrate having high thermal conductivity and simultaneously increasing the mechanical strength as described above, the thickness of a ceramic substrate can be increased to a level which can endure thermal shock and mechanical shock, while reducing the heat resistance of the whole ceramic composite substrate.

Namely, in a silicon nitride composite substrate of the present invention, a $Si_3N_4$ substrate having a thermal conductivity of 90 W/m·K or more and a three-point flexural strength of 700 MPa or more is used, and when a metal layer is connected to one major surface thereof, the thickness of the ceramic substrate is controlled such that the thickness tc of the $Si_3N_4$ substrate and the thickness tm of the metal layer satisfy the relation formula 1:2 tm≦tc≦20 tm.

For improving the heat-cycle-resistance property of a ceramic composite substrate, it is effective to connect the metal layers on both major surfaces of the ceramic substrate, and in this case, the thickness of the ceramic substrate is so controlled that the above-mentioned thickness tc and the total thickness ttm of the metal layers connected on both major surfaces satisfy the relation formula 2: ttm≦tc≦10 ttm. In this case, it is preferable that the above-mentioned relation formula 1 is also satisfied. The thicknesses of the metal layers to be connected on both major surfaces may be the same or different.

Regarding the above-mentioned relation of tc and tm or ttm, when the thickness tc of a $Si_3N$, substrate is <2 tm in the case of a metal layer connected to one major surface of the $Si_3N_4$ substrate, or when tc<ttm in the case of metal layers connected to both major surfaces of the $Si_3N_4$ substrate, even a $Si_3N_4$ substrate having high strength as described above tends to crack by mechanical shock in mounting and manifests the generation of cracking by the heat-cycle. It is not preferable that tc is >20 tm in the case of a metal layer connected to one major surface, or tc is >ttm in the case of metal layers connected to both major surfaces, since heat resistance of the whole composite substrate increases under this condition.

The specific thickness of a $Si_3N_4$ substrate is preferably 1 mm or more, for preventing the generation of cracking and breakage by mechanical shock. However, when the thickness of a $Si_3N_4$ substrate is too large, the heat radiation property and heat-cycle property of the whole substrate decrease, therefore, it is desirable that this thickness is approximately 6 mm or less.

It is preferable that a $Si_3N_4$ substrate of the present invention has a warp such that the major surface on which semiconductor elements are mounted forms a concave surface at the early stage prior to the adhering of the metal layer. Further, it is preferable that this warp degree is in a range from 10 to 300 μm per 25.4 mm (inch) of the length of the major surface of the $Si_3N_4$ substrate.

If a metal plate is connected to the major surface in a concave form in a $Si_3N_4$ substrate having such warp and heat source elements such as a transistor chip and the like mounted thereon, when the amount of heat generation of elements increases to cause an increase in temperature of the whole circuit, tensile stress is applied to the major surface on which elements are mounted and compression stress is applied to the reverse major surface of the $Si_3N_4$ substrate, by this heat. Resultantly, the $Si_3N_4$ substrate initially warped to the element mounting side forming a concave surface is deformed toward such a direction that gives a parallel relation to the major part of the apparatus, and close adherence of the apparatus with the substrate is improved. Therefore, heat resistance of the whole apparatus can be further reduced.

BEST MODE FOR CARRYING OUT THE INVENTION

EXAMPLE 1

Figure 1:
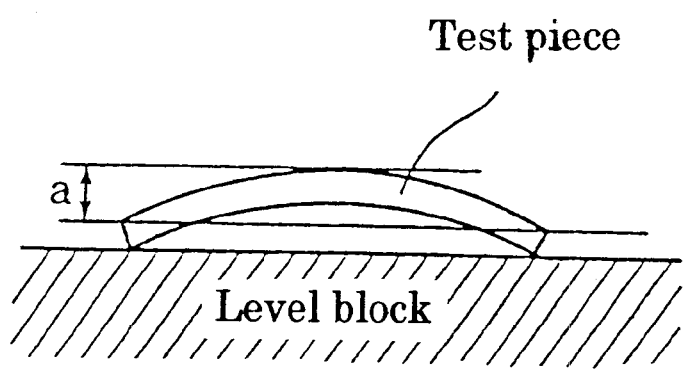
FIG. 1 is a view showing a method for measuring warp degree.

To a $Si_3N_4$ powder containing 1% by weight of oxygen and having an average particle size of 0.9 μm was added a $Y_2O_3$ powder (average particle size 1.0 μm) and a MgO powder (average particle size 1.0 μm) in amounts of 8% by weight and 0.5% by weight, respectively, based on the weight of the $Si_3N_4$ powder, and they were mixed in an alcohol solvent by a ball mill. Then, the mixture of raw material powders was dried, a binder component was added to and kneaded with the mixture, and a plurality of molded bodies in the form of a sheet were made from the kneaded mixture by dry mold press. These molded bodies were subjected to a degrease treatment in a nitrogen atmosphere, then, sintered for 4 hours at 1800° C. in a nitrogen atmosphere, to obtain $Si_3N_4$ substrates. The amount of an impurity, Al in the sintered bodies was quantified by an ICP emission analysis method to resultantly find that it was about 0.1% by weight. This impurity Al is assumed to be derived from raw materials.

Then, samples having a diameter of 10 mm and a thickness of 3 mm for measuring thermal conductivity were obtained by processing a part of the resulted sintered bodies, and the thermal diffusivity was measured by a laser flush method and the thermal conductivity was calculated according to the calculation formula: $K=\alpha \times C \times \rho$ ($\alpha$: thermal diffusivity, C: specific heat, $\rho$: density). Further, transverse test pieces of 4×3×40 mm were made by grinding a part of the resulted sintered bodies, which were subjected to a three-point flexural test according to JIS standard (R-1601) at a span of 30 mm. As a result, these $Si_3N_4$ sintered bodies had a thermal conductivity of 110 W/m·K and a three-point flexural strength of 950 MPa.

The resultant $Si_3N_4$ sintered bodies were subjected to grinding and polishing to obtain $Si_3N_4$ substrates having a length of 32 mm and a width of 75 mm and varying thicknesses as shown in Table I. The warp degrees per 25.4 m (1 inch) of the length of substrates were measured, and the results are shown in Table I. The warp degree was recognized as follows. The substrate, test piece was placed on a level block as illustrated in FIG. 1, and a dial gauge was scanned along the diagonal on the upper surface thereof to measure the difference between the maximum distance and the minimum distance from the level block (a in FIG. 1), and this value was divided by the total length scanned (inch unit) to obtain a warp degree value of the substrate. A copper plate containing no oxygen having thickness tm or the total thickness ttm as shown in Table I was connected to the major surface of the concave side in the samples 1 to 6 and to both major surfaces in the samples 7 to 10 by using a brazing material containing active metals, to obtain ceramic composite substrates. The brazing material contained active metals, Ti, Ag and Cu in amounts of 1.75, 63 and 35.25% by weight, respectively.

After connection of the $Si_3N_4$ substrate to the copper plate, it was confirmed by an ultrasonic flaw detection method that there was no cavity between the substrate and the copper plate, then, the composite substrate was subjected to a heat-cycle test. In the heat-cycle test, a composite substrate was cooled for 20 minutes at −40° C., maintained at room temperature for 20 minutes, heated for 20 minutes at 125° C., and further maintained at room temperature for 20 minutes (these operations are included in one cycle), and the occurrence of cracking and the number of heat-cycles until the occurrence of cracking was confirmed by a fluorescent flaw detection method. Further, heat resistances of the composite substrates were measured, and heat radiation property of the whole circuit was checked. For the measurement of heat resistance, a Si transistor chip of 10×10 mm was mounted as a heat source on the copper plate connected to the major surface on the concave side of the composite substrate, and evaluation was effected. The results are shown together in Table I below.

TABLE I

| Sample | Thickness of substrate tc (mm) | Thickness of copper plate tm, ttm (mm) | tc/tm (tc/ttm) | Warp degree (μm/in) | Number of cracks | Number of heat cycle | Heat resistance (° C./W) |
|---|---|---|---|---|---|---|---|
| 1 | 2 | 0.3 | 6.7 | 100 | 0 | >3000 | 0.6 |
| 2 | 1 | 0.3 | 3.3 | 200 | 0 | >3000 | 0.3 |
| 3 | 0.6 | 0.3 | 2.0 | 250 | 0 | >3000 | 0.25 |
| 4 | 5 | 0.3 | 16.7 | 15 | 0 | >3000 | 1.2 |
| 5* | 6.3 | 0.3 | 21.0 | 9 | 0 | >3000 | 2.0 |
| 6* | 0.5 | 0.3 | 1.67 | 310 | 0 | 1500 | 0.3 |
| 7 | 2 | 0.3 + 0.3 | 3.3 | 95 | 0 | >3000 | 0.4 |
| 8 | 5 | 0.3 + 0.3 | 8.3 | 10 | 0 | >3000 | 0.8 |
| 9 | 2 | 0.1 + 0.3 | 5.0 | 90 | 0 | >3000 | 0.5 |
| 10* | 2 | 1.5 + 0.3 | 1.1 | 90 | 0 | >3000 | 0.3 |

Note:
*comparative examples. The total thickness ttm in the copper plates of the samples 7 to 10 is the sum of the thicknesses on respective major surfaces.

As is known from these results, it has been proved that, in the samples of the present invention using a $Si_3N_4$ substrate having a thermal conductivity of 110 W/m·K and a three-point flexural strength of 950 MPa, and in which the thickness tc of the substrate and the thickness tm of the metal layer or the total thickness ttm are controlled so that $2tm \leq tc \leq 20\,tm$ or $1 \leq tc/ttm \leq 10$, cracking does not occur on the $Si_3N_4$ substrate even when the number of cycles reaches 3000 in the heat-cycle test, and simultaneously, heat resistance of the whole composite substrate also decreases, showing excellent heat radiation properties.

On the other hand, in the composite substrate of the sample 5 of the comparative example in which tc/tm>20 or tc/ttm>10, the thickness of the $Si_3N_4$ substrate was too large showing. Consequently, poor heat radiation property of the whole circuit and a significant increase in heat resistance of the whole composite substrate increased significantly to as high as 2.0° C./W. In the sample 6 of the comparative example in which tc/tm<2 or tc/ttm<1, heat-cycle-resistance property decreased, and in the heat-cycle test, cracking occurred on the substrate when the cycle number was yet small, by reduction of the thickness of the $Si_3N_4$ substrate. In the samples 3 and 6 wherein the thickness of the $Si_3N_4$ substrate was less than 1 mm, cracking and breakage tended to occur on the substrate by mechanical shock in the making process.

EXAMPLE 2

$Si_3N_4$ substrates were made in the same manner as in Example 1 except that the kind and added amount of sintering aids to be added to the $Si_3N_4$ powder were changed as shown in the following Table II, and heat conductivities and their three-point flexural strengths were evaluated accordingly. These results are shown together in Table II. For comparison, the results on the $Si_3N_4$ substrate of Example 1 (sample 1) are also shown together in Table II. The amount of impurities in each $Si_3N_4$ substrate was 1% by weight for oxygen and 0.1% by weight for Al likewise in each sample in Example 1.

TABLE II

| Sample | Kind and added amount of sintering aid (wt %) | Conductivity (W/m · K) | Three-point flexural strength (Mpa) |
|---|---|---|---|
| 1 | $Y_2O_3(8)$ + MgO(0.5) | 110 | 950 |
| 11 | $Sm_2O_3(8)$ + MgO(0.5) | 110 | 900 |
| 12 | $Yb_2O_3(8)$ + MgO(0.5) | 140 | 900 |
| 13 | $Y_2O_3(4)$ + $Yb_2O_3(4)$ + MgO(0.5) | 138 | 900 |
| 14 | $Y_2O_3(4)$ + $Sm_2O_3(4)$ + MgO(0.5) | 100 | 1000 |
| 15 | $Yb_2O_3(4)$ + $Sm_2O_3(4)$ + MgO(0.5) | 105 | 950 |
| 16 | $Y_2O_3(8)$ + $TiO_2(0.5)$ | 110 | 900 |
| 17 | $Y_2O_3(8)$ + $Ta_2O_3(0.5)$ | 115 | 1000 |
| 18 | $Y_2O_3(8)$ + $Li_2O(0.5)$ | 90 | 900 |
| 19 | $Y_2O_3(8)$ + CaO(0.5) | 95 | 880 |
| 20 | $Y_2O_3(4)$ + $Sm_2O_3(4)$ + MgO(0.3) + $Ta_2O_3(0.2)$ | 100 | 1000 |
| 21* | $Y_2O_3(0.4)$ + MgO(1) | 80 | 680 |
| 22* | $Y_2O_3(15)$ + MgO(0.5) | 75 | 850 |
| 23* | $Sm_2O_3(0.4)$ + $TiO_2(5)$ | 70 | 500 |
| 24* | $Sm_2O_3(15)$ | 75 | 830 |
| 25* | $Yb_2O_3(0.4)$ + CaO(1.0) | 65 | 600 |
| 26* | $Yb_2O_3(15)$ | 65 | 800 |

(Note):
*comparative examples.

As is known from these results, even if $Yb_2O_3$ or $Sm_2O_3$ is used in addition to $Y_2O_3$, these are rare earth oxides to be added as a sintering aid, a $Si_3N_4$ substrate having excellent properties of a thermal conductivity of 100 W/m·K or more and a three-point flexural strength of 900 MPa or more is obtained, and particularly in the sample 12 using $Yb_2O_3$, a substrate having a high heat conductive property as extremely high as 140 W/m·k was obtained. Further, in the examples 16 to 20, oxides Ti, Ta, Li and Ca the amounts of each not being more than 1% by weight were added in addition to MgO, as sintering aids other than rare earth oxides. Even if these oxides were used, compact $Si_3N_4$ sintered bodies could be obtained by sintering at lower temperatures of not more than 1800° C., like in the case of MgO.

On the other hand, in the comparative examples, samples 21 to 26, when the amount of a rare earth oxide added was as low as 0.4% by weight, the amount of liquid phase produced in the process of compaction of the $Si_3N_4$ particle was small, and in spite of sintering at a temperature as high as 1950° C., a compact sintered body could not be obtained. As a result, the resulted $Si_3N_4$ sintered body had lower thermal conductivity, and also lower three-point flexural strength. However, when the amount of a rare earth oxide added was substantially high such as 15% by weight, thermal conductivity decreased due to the increase in the volume proportion of grain boundary phase occupying the whole sintered body.

Next, the above-mentioned $Si_3N_4$ sintered bodies were processed into $Si_3N_4$ substrates having a thickness of 2 mm, and warp degrees per 25.4 mm of the length of the substrate were measured in the same manner as in Example 1. A copper plate containing no oxygen having a thickness of 0.3 mm was connected to the major surface on the concave side using a brazing material containing active metals. Using the resultant ceramic composite substrates, the occurrence of cracking and the number of heat-cycles until the occurrence of cracking were confirmed by a heat-cycle test, and heat radiation property of the whole circuit was checked by measuring heat resistance, in the same manner as in Example 1. These results are shown together in Table III below.

TABLE III

| Sample | tc/tm (tc/ttm) | Warp degree (μ/in) | In occurrence of cracking Number of cracks | In occurrence of cracking Number of heat cycle | Heat resistance (° C./W) |
|---|---|---|---|---|---|
| 11 | 6.7 | 90 | 0 | >3000 | 0.6 |
| 12 | 6.7 | 90 | 0 | >3000 | 0.48 |
| 13 | 6.7 | 100 | 0 | >3000 | 0.5 |
| 14 | 6.7 | 85 | 0 | >3000 | 0.7 |
| 15 | 6.7 | 100 | 0 | >3000 | 0.7 |
| 16 | 6.7 | 100 | 0 | >3000 | 0.6 |
| 17 | 6.7 | 110 | 0 | >3000 | 0.6 |
| 18 | 6.7 | 95 | 0 | >3000 | 0.7 |
| 19 | 6.7 | 80 | 0 | >3000 | 0.7 |
| 20 | 6.7 | 70 | 0 | >3000 | 0.8 |
| 21* | 6.7 | 100 | 5 | 500 | 1.2 |
| 22* | 6.7 | 90 | 0 | >3000 | 1.5 |
| 23* | 6.7 | 120 | 4 | 450 | 1.5 |
| 24* | 6.7 | 110 | 0 | >3000 | 1.7 |
| 25* | 6.7 | 100 | 6 | 380 | 1.2 |
| 26* | 6.7 | 95 | 0 | >3000 | 1.3 |

(Note):
*comparative examples.

As can be seen from these results, in the samples 11 to 20 of the present invention using $Si_3N_4$ substrates having excellent thermal conductivity and mechanical strength and in which the ratio of the thickness of the substrate to the thickness of the copper plate has a given value, ceramic composite substrates excellent in heat-cycle-resistance property and heat radiation property were obtained. However, it is known that, in the samples 21 to 26 of the comparative examples, heat resistance of the composite substrate increases since thermal conductivity of the $Si_3N_4$ substrate is low, and particularly in the samples 21, 23 and 25 using $Si_3N_4$ substrates having poor strength, cracking tends to occur on the substrate by thermal shock in the heat-cycle test.

EXAMPLE 3

$Si_3N_4$ substrates were made in the same manner as in Example 1 except that the amount of oxygen and the amount of Al in raw material powders were changed as shown in Table IV below $Si_3N_4$ sintered bodies were produced in samples 27 to 32, and heat conductivities and three-point flexural strengths were evaluated in the same manner. The results are shown together in Table IV. For comparison, the results on the $Si_3N_4$ substrate of Example 1 (sample 1) are also shown.

TABLE IV

| Sample | Sintering aid (wt %) | Amount of impurities in raw material powder Oxygen (wt %) | Amount of impurities in raw material powder Al (wt %) | Conductivity (W/m · K) | Three-point flexural strength (Mpa) |
|---|---|---|---|---|---|
| 1 | $Y_2O_3$(8) + MgO(0.5) | 1 | 0.1 | 110 | 950 |
| 27 | $Y_2O_3$(8) + MgO(0.5) | 2 | 0.1 | 95 | 1100 |
| 28 | $Y_2O_3$(8) + MgO(0.5) | 0.5 | 0.1 | 120 | 930 |
| 29 | $Y_2O_3$(8) + MgO(0.5) | 1 | 0.2 | 90 | 1200 |
| 30 | $Y_2O_3$(8) + MgO(0.5) | 1 | 0.05 | 120 | 900 |
| 31* | $Y_2O_3$(8) + MgO(0.5) | 3 | 0.1 | 70 | 1200 |
| 32* | $Y_2O_3$(8) + MgO(0.5) | 1 | 0.5 | 50 | 1250 |

(Note):
*comparative examples.

When the amount of oxygen or the amount of Al in the raw material powder increases, the sintering property of $Si_3N_4$ is improved. Consequently, the resultant sintered body becomes more compact, and mechanical strength increases. However, thermal conductivity of the $Si_3N_4$ sintered body decreased. The reason for this is that, by solving oxygen and Al in $Si_3N_4$ particles, the inherent crystal structure of the $Si_3N_4$ crystal becomes more complicated, and phonons are remarkably scattered in the particles.

Next, the above-mentioned $Si_3N_4$ sintered bodies of the samples 27 to 32 shown in the above-mentioned Table IV were processed into $Si_3N_4$ substrates having a thickness of 2 mm, and warp degrees per 25.4 mm of the length of the substrate were measured in the same manner as in Example 1. A copper plate containing no oxygen having a thickness of 0.3 mm was connected to the major surface on the concave side using a brazing material containing active metals. Using the resultant ceramic composite substrates, the occurrence of cracking and the number of heat-cycles until cracking occurred were confirmed by a heat-cycle test, and heat radiation property of the whole circuit was evaluated by measuring heat resistance, in the same manner as in Example 1. These results are shown in Table V.

The $Si_3N_4$ substrate of the sample 1 in the above-mentioned Table IV was processed into a $Si_3N_4$ substrate having a thickness of 2 mm, an aluminum plate having a thickness of 0.3 mm was connected as a sample 1-a to the major surface in a concave form of the substrate by a brazing material containing an aluminum (composition: Ag 63 wt %, Cu 33.25 wt %, Ti 1.75 wt %, and Al 2 wt %). Further, as a sample 1-b, aluminum plates each having a thickness of 0.3 mm were connected to both major surfaces of the $Si_3N_4$ substrate in the same manner as described above. The resulted composite substrates were evaluated by the same method as described above, and the results are shown together in Table V.

TABLE V

| Sample | Metal layer | tc/tm (tc/ttm) | Warp degree (μm/in) | In occurrence of cracking Number of cracks | In occurrence of cracking Number of heat cycle | Heat resistance (° C./W) |
|---|---|---|---|---|---|---|
| 27 | Cu | 6.7 | 80 | 0 | >3000 | 0.7 |
| 28 | Cu | 6.7 | 100 | 0 | >3000 | 0.5 |
| 29 | Cu | 6.7 | 80 | 0 | >3000 | 0.65 |
| 30 | Cu | 6.7 | 90 | 0 | >3000 | 0.45 |
| 31* | Cu | 6.7 | 110 | 0 | >3000 | 1.8 |
| 32* | Cu | 6.7 | 105 | 0 | >3000 | 1.9 |
| 1-a | Al | 6.7 | 100 | 0 | >3000 | 1.0 |
| 1-b | Al (both surfaces) | 3.3 | 100 | 0 | >3000 | 0.7 |

(Note):
*comparative examples.

As the above-described results indicate, in the samples 27 to 30 and samples 1-a to 1-b of the present invention using $Si_3N_4$ substrates having excellent thermal conductivity and mechanical strength and in which the ratio of the thickness of the substrate to the thickness of the copper plate has a given value, ceramic composite substrates excellent in heat-cycle-resistance property and heat radiation property were obtained. However, in samples 31 to 32 of the comparative examples, the heat resistance of the composite substrate increased greatly since the thermal conductivity of the $Si_3N_4$ substrate was low.

Further, as is known from the results of the samples 1-a and 1-b, composite substrates having an excellent heat radiation property were obtained even if an aluminum plate was used in addition to a copper plate, as a metal plate to be connected to the $Si_3N_4$ substrate.

Industrial Applicability

According to the present invention, a ceramic composite substrate which can tolerate the mechanical load when mounting or installing and has an excellent heat-cycle-resistance property and heat radiation property can be obtained, by using a $Si_3N_4$ substrate having a higher thermal conductivity than that of a conventional $Si_3N_4$ sintered body and simultaneously having mechanical strength, and by controlling the thickness of the $Si_3N_4$ substrate and the thickness of a metal layer to be connected to the substrate in a specific range.

What is claimed is:

1. A silicon nitride composite substrate comprising a silicon nitride ceramic substrate having a thermal conductivity of 90 W/m·K or more and a three-point flexural strength of 700 MPa or more, and a metal layer connected to one major surface thereof, wherein the thickness tc of the silicon nitride ceramic substrate and the thickness tm of the metal layer satisfy the relation formula: 2 tm<tc≦20 tm.

2. A silicon nitride composite substrate comprising a silicon nitride ceramic substrate having a thermal conductivity of 90 W/m·K or more and a three-point flexural strength of 700 MPa or more, and a metal layer connected to both major surfaces thereof, wherein the thickness tc of the silicon nitride ceramic substrate and the total thickness ttm of the metal layers on both major surfaces satisfy the relation formula: ttm<tc≦ttm.

3. A silicon nitride composite substrate comprising a silicon nitride ceramic substrate having a thermal conductivity of 90 W/m·K or more and a three-point flexural strength of 700 MPa or more, and a metal layer connected to one major surface thereof, wherein the thickness tc of the silicon nitride ceramic substrate and the thickness tm of the metal layer satisfy the relation formula: 2 tm<tc≦20 tm, and wherein the silicon nitride ceramic substrate before connection of the metal plate has a warp such that the major surface on which semiconductor elements are mounted forms a concave surface.

4. The silicon nitride composite substrate according to claim 3, wherein said warp degree is from 10 to 300 μm per 25.4 mm of the length of the substrate.

5. The silicon nitride composite substrate according to any of claim 1, wherein said silicon nitride ceramic substrate contains a rare earth element in an amount of 0.6 to 10% by weight in terms of an oxide and at least one element selected from Mg, Ti, Ta, Li and Ca in an amount of 0.5 to 1.0% by weight in terms of an oxide, and impurity oxygen in an amount of 2% by weight or less and Al in an amount of 0.2% by weight or less in terms of an oxide.

6. The silicon nitride composite substrate according to claim 5, wherein said rare earth element is at least one selected from Y, Sm and Yb.

7. The silicon nitride composite substrate according to any of claim 1, wherein said metal layer is composed mainly of copper.

8. The silicon nitride composite substrate according to any of claim 1, wherein said metal layer is composed mainly of aluminum.

9. The silicon nitride composite substrate according to claim 1, wherein the thickness of the silicon nitride ceramic substrate is 1 mm or more.

* * * * *